United States Patent [19]

Cassat

[11] Patent Number: 4,565,606

[45] Date of Patent: Jan. 21, 1986

[54] METALLIZATION OF ELECTRICALLY INSULATING POLYIMIDE/AROMATIC POLYAMIDE FILM SUBSTRATES

[75] Inventor: Robert Cassat, Ternay, France

[73] Assignee: Rhone-Poulenc Recherches, Courbevoie, France

[21] Appl. No.: 600,457

[22] Filed: Apr. 16, 1984

[30] Foreign Application Priority Data

Apr. 15, 1983 [FR] France ............................... 83 06404

[51] Int. Cl.$^4$ ............................................... C25D 5/56
[52] U.S. Cl. ......................................... 204/20; 204/30
[58] Field of Search ....................... 204/15, 20, 30, 38.4

[56] References Cited

U.S. PATENT DOCUMENTS

| | | | |
|---|---|---|---|
| 3,551,304 | 12/1970 | Letter | 204/15 |
| 3,558,441 | 1/1971 | Chadwick | 204/30 |
| 3,619,382 | 11/1971 | Lupinski | 204/15 |
| 3,767,538 | 10/1973 | Politycki | 204/38.4 |

*Primary Examiner*—T. M. Tufariello

*Attorney, Agent, or Firm*—Burns, Doane, Swecker & Mathis

[57] ABSTRACT

Electrically insulating polyimide/aromatic polyamide film substrates are conductively metallized, e.g., to provide highly thermally stable base members useful in the fabrication of printed circuits and the like, by (1) shaping into such essentially thermosetting film substrate an intimate homogeneous admixture of a film-forming polyimide/aromatic polyamide matrix having from 20 to 60 percent by total weight of said admixture of finely divided, non-conductive metal oxide particles uniformly distributed therein, (2) disrupting at least one face surface of said shaped film substrate to expose thereon a plurality of said finely divided, non-conductive metal oxide particles, (3) treating said at least one disrupted face surface with a preferably borohydride reducing agent to reduce said exposed metal oxide particles into a layer of electrically conductive free metal, whereby said at least one surface is rendered electrically conductive, and, advantageously, (4) electrolytically depositing a reinforcing, electrically conductive metallic overlayer atop said first layer of electrically conductive free metal.

35 Claims, No Drawings 4,565,606

METALLIZATION OF ELECTRICALLY INSULATING POLYIMIDE/AROMATIC POLYAMIDE FILM SUBSTRATES

CROSS-REFERENCE TO RELATED APPLICATION

Cassat et al copending application, Ser. No. 600,833, filed concurrently herewith and assigned to the assignee hereof.

BACKGROUND OF THE INVENTION

1. Field of the Invention:

The present invention relates to metallizing the face surfaces of thermally stable electrically insulating films of synthetic imide/aromatic polyamide plastics, and also to the intermediate and finished products produced by said metallization. The present invention more especially relates to applying strongly adherent and ductile metallic coatings to flexible, essentially thermosetting polymer films, preferably by electrolytic means, but also by chemical means.

2. Description of the Prior Art:

The pace of the development of electronics in everyday life, as well as in industry, is in part reflected in the number of research projects geared to cost reduction and/or miniaturization of printed circuits and the like.

Flexible films have been extensively used both as a supporting substrate for circuitry (printed circuits) and as various other components in a wide variety of electronic systems. Thus, it is required to provide both the face surfaces and thicknesses thereof with well-defined zones of either electrical conductivity or electrical insulation.

While certain rigid substrates such as paper coated with bakelite and then with phenolic or epoxy resins have long been used to fulfil this need, the present trend is in the direction of flexible substrates of film-forming thermoplastic or thermosetting polymers. These polymers are selected as a function of the intended application and the particular properties required, and include, for example:

Poly(ethylene glycol)terephthalate, polypropylene, polyacetals if high temperature strength is not required, fluoride polymers, polyethersulfones, polyetherimides, polyphenylene sulfides, modified polyphenylene oxides, polyarylates, polybenzimidazoles, polyimide/amides, wholly aromatic polyimides or polyamides, if high strength is desired at elevated temperatures, and the like.

Numerous processes are described in the literature for metallizing the face surfaces of plastic films. The processes which entail lamination by various means to apply a metallic foil onto the plastic film and the processes which entail deposition of conductive or insulating coatings by applying to the base substrate a binder matrix which adheres thereto and which contains conductive or insulating inorganic compounds, are reviewed briefly hereinafter:

First, Process P 25 of Philips in *Electronic Production*, page 8, December 1973, is pointedly representative of the prior art. It employs a palladium reduction process.

This process features the sensitization of $TiO_2$ dispersed throughout the volume of the film substrate by light (365 nm radiation) and the reduction of palladium chloride to metallic palladium. It is necessary in a second step to chemically reinforce the metallic surface layer. The process thus has the disadvantages of providing only surface effects and requiring a chemical metallizing step.

Among other processes, that described in U.S. Pat. No. 3,767,538 is also representative. It consists of roughening the surface of a polyester or polyimide film by chemical treatment, of creating conductive palladium nuclei, and of depositing by chemical means or by evaporation a layer of silver, which is subsequently chemically reinforced also. It will thus be seen that such a process is quite lengthy and expensive.

Accordingly, serious need exists in this art for methodology for the fabrication of electronic circuits for industry, the goals of which being:

(i) Substantial reduction in production costs (layout, drilling, stripping, etc.);
(ii) Improvements in the quality of the finished circuits;
(iii) Increased interconnection density; and
(iv) Compliance with the increasingly severe antipollution standards.

It is also required that any such improved methodology provide both rigid and flexible flat circuits and equally metallized holes. A further requirement is good quality of the metallic deposit, e.g., a highly coherent deposit strongly adherent to the support and a ratio of the deposit within the holes to the planar deposit itself being at least as high as 1.

SUMMARY OF THE INVENTION

Accordingly, a major object of the present invention is the provision of an improved process whereby certain well-defined zones of electrically insulating imide/aromatic amide plastic films are rendered conductive, which zones may then be directly structurally reinforced, if necessary employing electrolytic means. Hence, the disadvantages of chemical metallization are obviated, the same being a very slow process characterized by deposition rates on the order of only about one micron per hour and which is entirely unsuitable when metallic layers having a thickness in excess of 20 microns are sought to be produced. In order to obtain such thick coatings, chemical deposition to a thickness on the order of a few microns is typically first carried out, followed by a second deposition employing electrolytic means. The electrolytic method is incomparably more rapid, applying the coating at a rate of deposition on the order of 50 to 100 microns per hour. It will be appreciated, and this is another observation respecting the aforesaid Philips process, that electrolytic metallization cannot be immediately carried out following the stage of substrate activation, in view of the fact that the resulting discontinuous surface of metallic particles obtained is not sufficiently conductive, wherefore it is necessary to employ an intermediate stage of chemical growth in order to obtain the necessary electrical conductivity required for electrolysis.

Another object of this invention is the provision of flexible imide or aromatic amide polymer films capable of being coated, for example, with a layer of copper having a thickness on the order of one micron. This layer is sufficient to render the film electrically conductive. Furthermore, as it is anchored within the film itself, it is very highly adherent thereto. Subsequently, thicker metallic layers may be deposited which are also strongly adherent thereto. Such films may also be made moldable by using thin coatings of a low melting metal.

Briefly, the present invention features the metallization of electrically insulating, flexible films of film-forming polymers comprising imide and/or aromatic amide recurring units, by (i) first preparing a homogeneous admixture of the film-forming polymer and 20 to 60% by weight, with respect to the total weight of the composition, of a finely divided, non-conductive non-precious metal oxide, optionally in the presence of a solvent and various adjuvants, (ii) next shaping said admixture into sheet form either by extrusion or casting, (iii) then drawing said sheet or film by a conventional process or otherwise abrading the surface thereof to expose free oxide particles to ambient, (iv) next reducing the metal oxide particles to their free metallic state by treatment with a borohydride to electrically conductivise the face surface areas thereof thus treated, and (v) thence electrolytically reinforcing said conductivised surface areas with a metallic layer.

DETAILED DESCRIPTION OF THE INVENTION

More particularly according to the present invention, using the subject metallized films enables the facile production of printed circuits by the following steps:

(a) First coating the reduced and optionally reinforced conductivised film with a photosensitive resist material;
(b) Developing said photosensitive resist material;
(c) Directly electrolytically reinforcing the resulting film;
(d) Eliminating the developed photosensitive resist material; and
(e) Non-selectively etching away free metal to provide a circuit pattern on said treated film substrate.

The polymeric film substrates metallized according to this invention are comprised of imide or aromatic amide recurring units, are essentially thermosetting polymers and have good thermal stability. Such polymers are described, for example, in French Pat. Nos. 1,256,203, 1,239,491, 1,472,898 and 2,134,581 which relate to materials marketed by E. I. du Pont de Nemours & Co. under the trademarks KAPTON, KEVLAR or VESPEL; in French Pat. Nos. 1,555,564, 1,575,839, 2,046,498, 2,094,607, 2,260,596, 2,422,696 and 3,562,229 and 3,658,764 which relate to materials marketed by Rhone-Poulenc under the trademarks KINEL or KERIMD; in published Japanese Application J No. 52/085,474, featuring a polyimidisoindolquinazolinedione (PIQ) marketed by Hitachi; and in U.S. Pat. Nos. 3,787,364, 3,833,681, 3,838,097, 3,875,116, 3,968,083, 3,983,093, 3,991,004, DT Nos. 2,261,714, 2,261,715, 2,363,785, 2,364,246 and NL No. 74/08,336, which relate to polyetherimides marketed by General Electric Co.

These polymers may easily be converted into films and membranes by conventional techniques as extrusion of the molten material or by the casting of solutions thereof.

Non-conducting non-precious metal oxides are those metal oxides having no electrical conducting properties. These oxides must be present in the form of a very small particles, advantageously having grain size distributions ranging from 0.1 to 5 microns.

The total amount of metal oxide content ranges from 20 to 60% by weight of the total dry solids content of the admixture and preferably ranges from 30 to 50% by weight. It has been found that particularly favorable results are obtained by using cuprous oxide ($Cu_2O$) as the metal oxide.

Additives of the type used in paints may also be added to the composition in order to improve the suspension of the oxide and to stabilize the suspension. Wetting agents, protective colloids, emulsifiers, lubricating agents may also be used, provided that they do not modify the resistivity of the collodions, the molten compositions and the films ultimately obtained.

In the event that the admixture comprises an imide-amide prepolymer, trimellitic anhydride is advantageously added thereto. Such additive will facilitate the subsequent stripping of the polymer film from its casting support.

During the preparation of the collodions, the prepolymer is initially dissolved in an appropriate solvent until a solution is obtained, or the prepolymerization is carried out in a solvent medium. Subsequently, the metal oxide is added thereto.

The polymer solution with the metal oxide added is then treated by means similar to those used for the preparation of paints: Rayneri turbines with a high velocity of rotation, successive passages through singular or tricylindrical rod comminutors, for example.

The purpose of such treatment is to finely divide to the maximum possible extent the metal oxide agglomerates and to disperse them in the form of uniform grains.

If extrusion is employed, the mixture is prepared dry by homogenizing to the maximum possible extent, the mixture of the powders, optionally with the aforesaid additives incorporated therein.

Grinding prior to or after mixing may be necessary in order to obtain very fine powders without agglomerates.

The sheet or film is then formed by casting or extrusion by conventional methods.

Subsequently, the drawing or biaxial drawing of the film is effected to impart the necessary mechanical properties thereto. It has been found that this treatment suffices to expose the grains of the metal oxide and to remove any skin that could be covering same, without having to use a surface treatment therefor (sand blasting, abrasive rolls, cutting, chemical treatment, or the like).

The film may then be subjected, depending upon the requirements therefor, to a thermal stabilization treatment and/or perforated according to a pre-established pattern, if the film is intended for the manufacture of circuits with holes extending therethrough.

The surface resistivity of the film that may be obtained prior to reinforcement by electrolysis depends not only upon the proportion of the metal oxide therein, but also upon the extent of the reduction treatment. It has also been found that the surface of the film prior to reinforcement by electrolysis advantageously has a surface resistivity ranging from 0.01 $\Omega/\square$ to approximately $10^3$ $\Omega/\square$.

It too has been determined that the conversion of the cuprous oxide into metallic copper may be effected easily and quantitatively by the action of the borohydrides. This conversion is represented by the reaction:

$$4\ Cu_2O + BH_4^- \rightarrow 8\ Cu + B(OH)_3 + OH^-$$

The ease of this reaction is likely due to the catalytic effect of the copper metal, which could be explained by the intermediate formation of unstable copper hydride.

The borohydrides suitable for use in the present invention include both the substituted and unsubstituted borohydrides. Exemplary substituted borohydrides are those wherein a maximum of three hydrogen atoms of the borohydride ion have been replaced by inert substituents, such as, for example, alkyl radicals, aryl radicals, alkoxy radicals, and the like. Preferably, alkaline borohydrides are used, wherein the alkaline moieties comprise the alkali metals sodium or potassium. Exemplary of such compounds are sodium borohydride, potassium borohydride, sodium diethylborohydride, sodium trimethoxyborohydride, potassium triphenylborohydride, and the like.

The reducing step (iv) is effected simply by contacting the film with a solution of the borohydride in water, or in a mixture of water or an inert polar solvent, such as, for example, a lower aliphatic alcohol. Purely aqueous solutions of the borohydride are preferred. The concentrations of these solutions may vary over very wide limits, preferably from 0.05 to 1% by weight of the active hydrogen of the borohydride with respect to the solution. The reducing step (iv) may be carried out at elevated temperature; however, it is preferred to conduct it at a temperature in the vicinity of ambient, for example, at a temperature ranging from 15° C. to 30° C. Concerning the course of this reaction, it should be noted that it produces $B(OH)_3$ and $OH^-$ ions, which have the effect of increasing the pH of the medium during the reaction. At such high pH values, for example, in excess of 13, the reduction is slowed such that it may be advantageous to conduct this operation in a buffered medium to maintain a well-defined degree of reduction. After reduction, the film is rinsed.

At the onset of the reduction, the reaction essentially involves the cuprous oxide particulates located at the surface of the substrate and which are in direct contact with the reducing agent. Due to the catalytic effect of the copper metal, the reduction reaction then extends into the thickness of the film, especially if the resins comprising same do not have an especially marked hydrophilicity. The magnitude of the oxide reduction may thus be controlled principally and easily by varying the duration of the treatment. In order to obtain a resistivity in keeping with the desired values, the duration of the reduction operation is typically quite short and, depending upon the proportion of oxides comprising the substrate, it usually ranges from about one minute to fifteen minutes. For a given duration of treatment, it is also possible to influence the rate of reduction by adding various accelerators to the medium, such as, for example, boric acid, oxalic acid, citric acid, tartaric acid or metal chlorides, such as cobalt-II chloride, nickel-II chloride, iron-II chloride, manganese-II chloride, copper-II chloride, etc.

Any reduction over the aforesaid period of time entails but a portion of the thickness of the film. It should be noted that for electrical applications, it is important to reduce only a fraction of the thickness of the film, in order to maintain an unreduced, insulating internal portion to prevent the establishment of conducting bridges. In contrast, if holes are provided, it has been found that a layer of at least the same thickness as that on the surface, is established/reduced on the circumferential surface areas of the holes.

In view of the finely divided state of the copper obtained after the reducing treatment, it would be expected that its oxidation in air would be quite rapid. It has also been found, however, that this is not the case and that the degree of surface resistivity of the film after reduction does not increase even after several days of exposure to ambient air.

It is thus possible to store the reduced film in this state. As a precaution, either an incomplete rinsing may be carried out, leaving trace amounts of the reducing agents on the surface of the film, or a specific reducing agent may be added to the rinsing bath, for example, hydroquinone, or the rinsed and dried film may be protected by coating it with a protective film, for example, of the photosensitive resist material.

The reduced film may subsequently be metallized by deposition of a layer of copper, nickel or another metal thereon. This metallization may be carried out electrochemically, but it has been found, and this is one of the principal advantages of the process according to the present invention, that it may also be directly performed by an electrolytic process. For certain applications it is not unusual to require a metal layer deposition of less than 20 microns and, furthermore, the possibility of directly using an electrolytic process truly contributes to an industrially profitable operation. It will also be appreciated that conventional processing techniques too are within the scope of this invention, whereby the substrate is first subjected to chemical metallization, followed by reinforcement of such initial deposit by a subsequent electrolytic deposition. For a detailed description of operating conditions appropriate for chemical metallization, reference is made to *Encyclopedia of Polymer Science and Technology*, 8, pp. 658–661 (1968). The proportions of the components of the chemical bath, the duration of immersion of the film, the temperature and other operating conditions are determined for each particular case in known manner in order to obtain the best results.

Metallization by electrolysis is of course well known to this art; see, in particular, *Encyclopedia of Polymer Science and Technology*, 8, pp. 661–663 (1968). The suitably reduced film constitutes the cathode and the metal to be deposited, the anode. Both are immersed in an electrolyte through which a current is passed. For example, in the case of the electrolytic coating of copper, the metal deposited may proceed via monovalent or divalent copper originating, for example, from a cyanide electrolyte (monovalent copper) or an electrolyte based upon a sulfate, pyrophosphate or fluoborate (divalent copper). Several adjuvants may be added to the electrolyte: an alkali or alkaline earth metal salt, an acid (acidic copper bath or copper sulfate) or a base (alkaline stannate bath) to increase the conductivity of the electrolyte; a buffer to prevent rapid fluctuations in pH; materials to modify the resultant structure of the electrodepositions, surface active agents, a phenol, a phenol sulfonate, inorganic or organic brightening agents, a levelling agent, such as, for example, coumarin, etc. The quality of the electrodeposit, whether it is a metal or a metal alloy, depends upon the composition of the electrolyte and the physical conditions of electrolysis (temperature, density of the cathodic and anodic current, the anode/cathode distance, surface condition of the electrodes, etc.); the regulation of these different parameters is determined for each particular electrodeposit in known manner.

The fact that it is possible to extend the reduction into the thickness of the film makes it possible to generate the following advantages: during the metallization, a deep anchoring of the metal deposited onto the resin substrate is effected; in the case of welding by addition of a metal forming alloy, the alloy is also capable of migrating into the substrate, because there exists a true continuity of the copper throughout the thickness of the substrate; in the case of a metallization destined to play the role of a heat sink, it is possible to influence the capacity for heat transfer of the resin by the extent of the reduction within the mass of the film.

It is apparent that many modifications can be made to the various embodiments illustrated above, in particular by the substitution of equivalent means, for example, in the nature of the non-precious metal oxide that may be used, without departing from the scope of the present invention. Thus, the cuprous oxide may be replaced by oxides of other non-precious metals, the degree of oxidation of which is selected such as to permit the facile reduction of the oxide with a borohydride and which are capable of forming intermediately unstable metal hydrides. Exemplary such oxides are, for example, nickel-II, cobalt-II, lead-II, cadmium-II, chromium-III, antimony-III, and stannic-IV oxides.

Similarly, the stretching of the film may be eliminated and replaced by other means without exceeding the scope of the invention, if it is desired to employ an unstretched film. An alternative abrading treatment may thus be employed, as above indicated. It has also been found, furthermore, that in certain cases this abrading treatment may itself be eliminated without adverse effect on the subsequent processing steps.

During the electrolytic treatment it is possible to provide metal layers having a thickness on the order of one micron, anchored into the film and being strongly adherent thereto, in contrast to the results obtained by "electroless" deposition. Films comprising such a thin metal coating are of great value in the production of printed circuits, as they permit the elimination of defects and particularly inadequate etching during the subsequent etching treatments. It is thus possible to increase the density of the circuits and to improve their reliability.

It is obvious that it too is possible to provide much thicker metal deposits, on the order of 20 to 50 microns, for example, which are the thicknesses currently used in the production of printed circuits. It is similarly feasible to deposit by melting or by electrolytic means, layers of alloys of the lead/tin type.

The production of printed circuits from the reduced films may then be done by conventional additive processes and the circuitry ultimately inscribed in the electrolytically metallized/reduced films is effected by conventional etching.

Schematically, to obtain circuits with holes drilled into or through the base substrate, two methods may be briefly outlined. The first method, "pattern plating", consists of, beginning with films prepared according to the invention, the drilling of holes in predetermined locations, dust removal, the application of the photosensitive resist material, the development thereof and the reduction of the metal oxide according to the invention. Following rinsing with water a chemical metallization is carried out, the film washed, the developed photosensitive resist material removed, and the film then rinsed and dried.

Several variations on this method may be employed. It is in any event slow due to the chemical metallization stage.

The second method, "panel plating", which is much more important from an industrial standpoint, consists, also beginning with a film prepared according to the invention, of the drilling of holes in predetermined locations, optionally the removal of dust, reducing the metal oxide according to the invention, rinsing with water, the application of the photosensitive resist material, its development, followed by electrolytic metallization. After rinsing, the developed photosensitive resist material is removed and a non-selective etching step is carried out. After rinsing, the film is dried.

This method, which comprises one more step than the preceding method, is actually much more rapid, as electrolytic metallization maybe 100 times more rapid than its chemical counterpart. Furthermore, a great number of variations may be introduced to improve the speed of the process and the quality of the final products obtained therefrom.

The process according to the invention also makes it possible to fabricate metallized films, the metallic overlayers of which being as thin as 1 micron and firmly anchored into the polymer base, as well as themselves being highly coherent and strong. The subject process is distinguished from the processes of the prior art by its simplicity: (i) no sensitizing and activating of the film, and (ii) the capacity to eliminate the delicate operation of abrading the surface to expose the metal oxide included in the substrate. It is also distinguished by its low cost, i.e., no expensive palladium salts or powders of the precious metals are used. Furthermore, the technology is adapted to existing equipment/apparatus. Finally, it permits the fabrication of printed circuits by simple methods, optionally with any number of holes drilled therein or therethrough, under hitherto unattained economic conditions.

The process of the invention is also subject to a wide variety of modifications; as in each stage thereof it is possible to interrupt the process, for example, by intermediate storing of semi-finished product, with the final processing being deferred to a later time.

By varying the nature of the polymer, the amount of metal oxide included in the bulk volume of the film, the treatment following reduction and in particular the nature of the metal electrolytically deposited or chemically, metallized films are obtained that have numerous applications in very many fields, such as, for example, decoration, packaging wherein the properties of the metallic layer, such as gas permeability, U. V. barrier, availability or weldability, are particularly of interest, and the like. Said metallized films also find use in the optics field, e.g., as reflective surfaces, as well as for sound applications and those associated with the fields of electricity and electronics, wherein the films according to the invention may be used as the base for capacitors, keyboards, circuits, etc., and other applications as well.

In order to further illustrate the present invention and the advantages thereof, the following specific examples are given, it being understood that same are intended only as illustrative and in nowise limitative.

EXAMPLE 1

Preparation of a polytrimellimide-amide collodion, having a dry solids content of about 18%, used for the manufacture of films filled with cuprous oxide; the solvent employed was N-methylpyrrolidone Into a 100 liter reactor equipped with:
(i) An ICV gear motor for rotating a frame agitator at 50 rpm;
(ii) Double sidewalls, heated by means of an 8 kW electric plug, in the interspace between which was circulated the liquid heat transfer medium "Mobiltherm"

at a controlled temperature, with cooling thereof being assured by a secondary circuit;

(iii) A temperature sensor for detecting the temperature of the material within same, on a Honeywell recorder, from 0° to 200° C.;

(iv) An EIVS condenser having a diameter of 750 mm, connected to a degassing line at the top thereof with a bubble flask containing N-methylpyrrolidone (NMP) in operative association threwith; a counter is installed downstream of the bubble device to control the release of gas;

(v) A "quarter turn" base valve, model Gachot, 50 mm width passage;

(vi) A nitrogen inlet for surface flushing from a separate tank;

(vii) A mobile exhaust to be placed on the inlet stopper; and (viii) A 1 to 10 1/hour SEM pump for the introduction of the diluting NMP stored in a respiratory vessel under a layer of nitrogen.

Under a light protective layer of nitrogen gas and under agitation, the following materials were introduced into the above apparatus: 41.44 kg N-methylpyrrolidone, redistilled (water content 200 ppm); 10.08 kg 4,4'-diisocyanatodiphenylether (melting point, 62°-64° C., hydrolyzable chlorine less than 50 ppm) and 7.68 kg trimellitic anhydride.

The reactor was stoppered and the free volume thereof flushed for 30 minutes with a stream of nitrogen (1000 1/hour) and immediately heated in accordance with the following schedule:

| Duration | Bath Temp (°C.) | Reaction Mass Temp (°C.) |
|---|---|---|
| 0 | 20-30 | 20-30 |
| 1 hour, 30 min | 105-115 | 115-120 |
| 1 hour, 50 min | 135-140 | 135-140 |
| 2 hours, 30 min | 145-155 | 145-150 |
| 3 hours | 170-180 | 180 |
| 5 hours | 185-190 | 180-185 |

The evolution of gaseous carbon dioxide began at about 80° C., was at a maximum at 110°-120° C. (about 1800 1/hour) and terminated at 170° to 180° C. Upon reaching the plateau of 180°-185° C., the introduction, for 3 hours, of 28 kg of N-methylpyrrolidone for purposes of dilution was commenced. During this period of time heating was continued to attain a temperature of 190° C. in the reaction mass and such temperature was maintained throughout the reaction.

A first sample was taken after 10 hours of operation and the results of the viscosity measurements (Brookfield viscosimeter) plotted on a semilog diagram.

The viscosity of the collodion at that time was 50 to 200 poises at 25° C.

Depending upon the results of this first sample, other samples were taken every 2 hours and the curve of the rise in viscosity was plotted.

Cooling was begun when the viscosity of the collodion reached 1000 to 1100 poises to obtain a final product with a viscosity ranging from 1000 to 1500 poises, with the rise in viscosity continuing during cooling.

Cooling was carried out under a light countercurrent stream of nitrogen gas and tapping was done at 80° C.

80 kg of the collodion (theoretically, 83.70 kg) were recovered, the viscosity of which at 25° C. was 1300 poises (Brookfield viscosimeter) and the dry extract of which was 18% (ventilated oven, 3 hours at 220° C. on a specimen of approximately 2 g in a thin layer).

Preparation of the collodion charged with cuprous oxide

Into a 1.5 1 reactor equipped with a stainless steel agitator of anchor type, the twisted helical blades of which traveled at a distance of 2 mm from the wall of the reactor, 400 g of the collodion prepared as above and 200 g N-methylpyrrolidone were introduced, and agitated for 15 hours at 20°-25° C. for homogenization. The dry solids content of the collodion was thereby reduced to 12% and its viscosity to 160 poises (Brookfield viscosimeter).

Simultaneously, in a 50 ml Erlenmeyer flask, 0.720 g trimellitic anhydride (or 1% with respect to the dry solids comprising said collodion), 0.720 g 4,4'-diaminodiphenylether (also 1% with respect to the dry solids comprising said collodion), 1.44 g Nuosperse 657 ® (or 2% with respect to the dry solids comprising said collodion), were dissolved in 18 g N-methylpyrrolidone, 6 g acetylacetone and 3 ml of a solution containing 750 mg silicone oil (the product 640 V100 of Rhone-Poulenc in 50 ml N-methylpyrrolidone, constituting 45 mg of the oil 640 V100, or 0.0625% vis-a-vis the dry solids contained in the collodion).

This solution was added to the polytrimellimide-amide collodion, the dry solids content of which had been reduced to 12% and the viscosity to 160 poises by the addition of N-pyrrolidone, and the solution was agitated for 5 to 10 min for homogenization. Subsequently, under agitation and at the ambient temperature, over approximately 15 min, 88 g cuprous oxide were introduced to establish a ratio of cuprous oxide/dry solids in the collodion of 55/45, and homogenization was continued for one hour. The filled collodion was then treated in a Spagenberg monobar machine in order to disintegrate any cuprous oxide agglomerates present, stored in a 1.5 1 powder container and degassed in a dessicator under 20 mm mercury at ambient temperature for 1 to 2 hours.

Preparation of films from the collodion charged with cuprous oxide

Onto 500×430×8 mm glass plates, films of the filled collodion prepared as immediately above were deposited by means of a pouring vessel with a 35 cm width set at 6/10 mm. The plates were then heat treated in a ventilated oven at 120° C. for 25 min. At this stage, the film still contained 20-25% N-methylpyrrolidone.

Following the completion of this operation, the films were advantageously treated for 2 hours at 170° C. in a ventilated oven to completely eliminate the solvent and then easily stripped from their supports after having been cooled to the ambient temperature. After trimming the borders, 450×320 mm shaped articles were obtained, having a thickness of 90 microns and being free of surface defects. These films could not be directly reduced by a solution of potassium borohydride, and exposing the cuprous oxide filler at the face surfaces thereof by the mechanical abrading of both surfaces was required to insure the reduction of the copper $^{(I)}$ to the state of metallic copper (Cu° ).

Another method permitting the reduction of the cuprous oxide to metallic copper without a preliminary abrading of any face surface consisted of stretching the film after a heat treatment in a ventilated oven for 25 min at 120° C. At this stage the film still contained 20 to 25% of the solvent; it was stripped from its support and clamped between two jaws of a drawing machine, which were displaced in a parallel manner by means of a lead screw, the two threads of which were inversed. The machine and the film were then placed in a ventilated oven at 170° C. A first stretching of 15% was then effected in the machine direction of the casting operation by actuating the lead screw. The film was then released, rotated 90° with respect to the jaws and a second, biaxial stretching was carried out in a direction perpendicular to the direction of cast, in the above-described manner. A heat treatment in a ventilated oven was then effected at 170° C. for two hours to completely eliminate the solvent. After trimming the borders, 380×270 mm shaped articles were obtained, having a thickness of 85 microns; these films were flexible, not brittle and without surface defects; they could be reduced by the potassium borohydride solution without the necessity for any preliminary abrading of their face surfaces.

Reduction of the two face surfaces of the films via potassium borohydride solution In order that etching by additive method could be performed, the films must be conductive at the surfaces thereof. For this purpose, it was necessary to reduce the cuprous oxide filler to the state of metallic copper using a potassium borohydride solution.

The following materials were introduced into a 1000 l Erlenmeyer flask, in this order, after agitation and after diluting each reagent:

(i) 500 ml Distilled water;
(ii) 2.5 g Sodium hydroxide, in tablet form;
(iii) 5 g Sodium salt of a carboxymethylcellulose (Hercules type 7MF, average viscosity, PM 250 000);
(iv) 25 g Potassium borohydride; and
(v) 5 cm$^3$ of 1% Aqueous solution of Cemulsol DB 311 of S.F.O.S.

The films, the face surfaces of which had either been mechanically abraded or which had been stretched, were coated by immersion or by any other coating means (brushing, coated with powder, and the like) with the previously prepared reducing solution, then suspended vertically; following a contact time of 3 min to 3 min, 30 seconds, the reducing solution and the by-products of the reaction were eliminated by thorough washing with distilled water, accompanied by slight brushing, and then the films were washed with alcohol and dried with compressed air. The resistance measured between two points on the face surface spaced about 20 cm apart was 20 to 50 ohms and after trimming the borders there was no continuity between the two face surfaces of the film.

Preparation of flexible printed circuits

After reducing one of the face surfaces having a surface area of 4 dm$^2$ with the potassium borohydride solution, the film was subjected to electrolytic deposition, using an aqueous electrolyte solution containing 20 g/liter of copper sulfate (CuSO$_4$.5H$_2$O), 0.5 ml/liter concentrated sulfuric acid and 5 ml of the RP 500 brightening agent marketed by Rhone-Poulenc, with the cathode being the film itself and the anode consisting of the metal to be deposited (copper). The electrolysis was carried out for 7 min under 0.125 A/dm$^2$ and 7 min under 0.2 A/dm$^2$, the film rinsed with a stream of distilled water for 5 min, washed with ethanol and finally dried with compressed air. The resulting copper deposit was bright and was approximately 4 microns in thickness.

Subsequently, by brushing or any other coating method, a layer of Rhone-Poulenc's positive photoresist material, Maskoat 11, was deposited thereon and was permitted to stand for 15 min at ambient temperature under laminar flow hood in a perfectly horizontal plane. Drying was done in a horizontal conveyor furnace for 30 min employing three levels of temperature, i.e., 80°, 90° and 100° C.

A negative image of the circuit pattern to be reproduced thereon was placed on the photoresist film and exposed for 40 seconds to the radiation of a 2000 W ultraviolet lamp.

The photoresist material was then developed under agitation for 3 min in a 30% by volume solution of Rhone-Poulenc's Maskoat 13 developer, followed by rinsing under a stream of distilled water for 5 min and drying with compressed air.

The printed circuit, having a surface area of 40 cm$^2$, was then reinforced electrolytically in an electrolytic bath having the following composition:

| | |
|---|---|
| (1) Copper sulfate (CuSO$_4$.5H$_2$O) | 75 g/liter; |
| (2) Concentrated sulfuric acid | 180 mg/liter; |
| (3) Sodium chloride | 50 mg/liter; and |
| (4) P 500 additive (Rhone-Poulenc) | 5 mg/liter. |

The electrolysis was conducted for 1 hour under a current density of 3 A/dm$^2$ and the circuit was rinsed with a stream of distilled water for 5 min, then dried with compressed air.

The photoresist material was then eliminated by washing with acetone and the exposed electrolytic deposit etched away by immersion in a 10% aqueous solution of ferric chloride for 3 min, followed by rinsing with distilled water, treated with a 1% aqueous solution of sulfuric acid for 1 to 2 seconds, washed with distilled water and with ethanol and lastly dried with compressed air. A circuit was obtained wherein the thickness of the copper pattern was 35 microns, its surface brilliant and the pattern definition excellent.

EXAMPLE 2

To a solution of 200 g 4,4'-diaminodiphenylether (1 mole) in 2300 g N,N-dimethylacetamide (DMAC), 207 g (0.95 mole) pyromellitic dianhydride were slowly added, under agitation. The rate of the addition of the anhydride was controlled by raising the temperature of the contents of the reactor, which was not permitted to exceed 50° C.

The low viscosity collodion obtained in this manner was made viscous by adding thereto a solution of the dianhydride in DMAC, 11 g in 110 g, which was the complement to attain the stoichiometric composition.

The viscosity of the collodion increased rapidly by chain extension to reach approximately 1600 poises at ambient temperature upon completion of the addition, to yield a collodion with a dry solids content of 17.3%: polyamide-acid.

To this collodion were added, under agitation, 0.2 g of hydroxypolysiloxane methyl phenyl oil (640 V100 oil marketed by Rhone-Poulenc) and finally 420 g cuprous oxide, previously dried and made into a paste with DMAC. After homogenization, the filled collodion was treated in a manner used with paints, by passing it through a monobar machine to ensure dispersion of the pigment and to eliminate agglomerates of the filler, the average particle size of which was 1 micron.

To effect degassing of the filled collodion, it was exposed to a vacuum of 50 mm mercury at ambient temperature, in the pan member of a rotating evaporator.

The collodion was then poured onto a glass plate using a doctor blade having a clearance of 350 microns and dried in a ventilated oven for 30 min at 125° C.

The film stripped from its support was attached to a glass plate using drafting clamps with the borders of the film being folded over the edges of the support.

This assembly was then put into the oven under vacuum, the temperature raised to 300° C. and there maintained for 60 min to insure the conversion to polyimide.

The product film was very flexible, and had a high tensile and bending strength, in spite of its large percentage of filler material. The two face surfaces were slightly different; the bottom face surface (support side) was brighter than the top face surface. Electrical resistivity was $3.1 \times 10^{16}$ ohms/cm.

The film was slightly abraded on one of its face surfaces by rubbing with a suspension of alumina in water. After elimination of the abrading residue by slight brushing under water, the film was rinsed with alcohol and dried.

The abraded face surface was then reduced by applying a reducing compound thereto.

The reducing compound, based upon potassium borohydride, was prepared as follows:

(i) 100 ml Distilled water;
(ii) 0.5 g Sodium hydroxide, in tablet form;
(iii) 5 g of the Sodium salt of carboxymethylcellulose (Hercules type 7MF);
(iv) 5 g Potassium borohydride; and
(v) 1 cm$^3$ Cemulsol DB 311 diluted 100 times in water.

After a contact time of 5 minutes, the reducing compound, which had taken on a pronounced silvery sheen, was eliminated by rinsing under a stream of water, followed by washing with alcohol and drying.

The face surface treated in this manner and now electrically conductive was then subjected to a light electrolytic deposition of copper. The copper sulfate electrolytic bath was very slightly acidified with H$_2$SO$_4$ (0.3 ml/liter of acid having a density of 1.83) and contained 5 ml/liter of the RP 500 brightener marketed by Rhone-Poulenc.

The deposition of copper was carried out under 0.15 A/dm$^2$ for a few minutes to obtain a deposit thickness of approximately 2 microns.

The film was then abraded as above on its untreated face surface by means of an abrasive in suspension, then holes therethrough drilled with a hollow punch having a diameter of 2 mm.

The reduction operation performed previously was twice carried out on the abraded face surface with the same composition, with intermediate rinsing and drying.

This reduced face surface, after rinsing and drying, was brush-coated with a positive Maskoat 11 photoresist material marketed by Rhone-Poulenc, then dried and finally insulated with a mask covering each perforation under a square area having 5 mm side dimensions.

Following development in an aqueous solution of Rhone-Poulenc's Maskoat 13 developer and then by rinsing and drying, the film was reinforced electrolytically on both face surfaces thereof and on the exposed sidewalls of the holes with the electrolytic bath previously used.

After a few minutes of reinforcement, the operation was continued in a more highly concentrated bath (75 g/liter of CuSO$_4$.5 H$_2$O + 180 g/liter H$_2$SO$_4$ having a density of 1.83 + 50 mg/liter NaCl + 5 ml RP 500), under a current density of 3 A/dm$^2$ for 45 min.

The film was then rinsed with water, and next with acetone to remove the photoresist material, then with an aqueous solution of FeCl$_3$ to etch away the non-reinforced reduced copper and, finally, with water and alcohol.

The face surface-reverse electrical functions assured by the metallized holes were satisfactory.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. A process for conductively metallizing an electrically insulating polyimide/aromatic polyamide film substrate, comprising (1) shaping into a thermally stable film substrate an intimate homogeneous admixture of an essentially thermosetting film-forming polyimide/aromatic polyamide polymer matrix having from 20 to 60 percent by total weight of said admixture of finely divided, non-conductive non-precious metal oxide particles uniformly distributed therein, (2) disrupting at least one face surface of said shaped film substrate to expose thereon a plurality of said finely divided, non-conductive metal oxide particles, and (3) treating said at least one disrupted face surface with a reducing agent to reduce said exposed metal oxide particles into a layer of electrically conductive free metal, whereby said at least one face surface is rendered electrically conductive.

2. The process as defined by claim 1, further comprising (4) electrolytically depositing a reinforcing, electrically conductive metallic overlayer atop said first layer of electrically conductive free metal.

3. The process as defined by claim 2, said polymer matrix comprising a polyimide, a polyimide-amide or an aromatic polyamide.

4. The process as defined by claim 3, said reducing agent comprising a borohydride.

5. The process as defined by claim 4, said reducing agent comprising a substituted or unsubstituted alkali metal borohydride.

6. The process as defined by claim 4, said film substrate comprising a flexible film-forming polymer.

7. The process as defined by claim 4, said finely divided, non-conductive non-precious metal oxide particles comprising cuprous oxide.

8. The process as defined by claim 7, said cuprous oxide particles having a grain size distribution ranging from 0.1 to 5 microns.

9. The process as defined by claim 1, said film substrate having a surface resistivity ranging from 0.01 $\Omega/\square$ to $10^3$ $\Omega/\square$ after the step (3).

10. The process as defined by claim 3, wherein said first layer of electrically conductive free metal extends into and is anchored within said shaped film substrate.

11. The process as defined by claim 10, said film-forming polymer matrix having from 30 to 50 percent by total weight of the admixture of said finely divided, non-conductive non-precious metal oxide particles uniformly distributed therein.

12. The process as defined by claim 4, said at least one face surface being disrupted by at least uniaxially stretching said shaped film substrate.

13. The process as defined by claim 12, said at least one face surface being disrupted by biaxially stretching said shaped film substrate.

14. The process as defined by claim 4, said at least one face surface being disrupted by surface abrading treatment.

15. The process as defined by claim 1, further comprising heat stabilizing said reduced film substrate.

16. The process as defined by claim 4, further comprising chemically depositing an electrically conductive metallic overlayer on said first layer of electrically conductive free metal prior to said electrolytic deposition step (4).

17. The process as defined by claim 4, the thickness of said first layer of electrically conductive free metal having a thickness on the order of about 1 micron.

18. The process as defined by claim 4, said electrolytically deposited overlayer having a thickness of at least 20 microns.

19. The process as defined by claim 4, said reduction (3) being such as to also reduce unexposed metal oxide particles located within a portion of the volume of said film substrate, but insufficient to conductively alter the electrically insulating characteristic thereof.

20. The process as defined by claim 1, said shaped film substrate having hole(s) bored therein upstream of said reducing step (3), the exposed metal oxide particles on the sidewall surfaces thereof also then being reduced into a layer of electrically conductive free metal at least as thick as said at least one face surface layer of electrically conductive free metal and being physically integral therewith.

21. The process as defined by claim 4, said borohydride reducing agent comprising a liquid solution thereof, the active hydrogen content thereof ranging from 0.05 to 1% by weight.

22. The process as defined by claim 4, a lead/tin alloy electrically conductive overlayer being electrolytically deposited atop said first layer of electrically conductive free metal.

23. The process as defined by claim 7, an electrically conductive copper overlayer being electrolytically deposited atop said first layer of electrically conductive free metal.

24. A process for the fabrication of a printed circuit comprising an electrically insulating polyimide/aromatic polyamide film substrate, which comprises (1) shaping into a thermally stable film substrate an intimate homogeneous admixture of an essentially thermosetting film-forming polyimide/aromatic polyamide polymer matrix having from 20 to 60 percent by total weight of said admixture of finely divided, non-conductive non-precious metal oxide particles uniformly distributed therein, (2) disrupting at least one face surface of said shaped film substrate to expose thereon a plurality of said finely-divided, non-conductive metal oxide particles, (3) treating said at least one disrupted face surface with a reducing agent to reduce said exposed metal oxide particles into a layer of electrically conductive free metal, whereby said at least one face surface is rendered electrically conductive, (4) coating said reduced and conductivised film substrate with a photosensitive resist overlayer, (5) imaging a circuit pattern onto said photosensitive resist overlayer and developing unimaged areas thereof, (6) electrolytically depositing a reinforcing, electrically conductive metallic overlayer atop said first layer of electrically conductive free metal, (7) removing photosensitive resist material therefrom, and (8) non-selectively etching said film substrate to define a conductive printed circuit pattern thereon.

25. The process as defined by claim 24, said reducing agent comprising a borohydride.

26. The process as defined by claim 25, said finely divided, non-conductive non-precious metal oxide particles comprising cuprous oxide.

27. The process as defined by claim 24, said shaped film substrate having hole(s) bored therein upstream of said reducing step (3), the exposed metal oxide particles on the sidewall surfaces thereof also then being reduced into a layer of electrically conductive free metal at least as thick as said at least one face surface layer of electrically conductive free metal and being physically integral therewith.

28. The process as defined by claim 24, further comprising (3a) electrolytically depositing an initial reinforcing, electrically conductive metallic overlayer atop said first layer of electrically conductive free metal, prior to said step (4).

29. The product of the process as defined by claim 1.

30. The product of the process as defined by claim 4.

31. The product of the process as defined by claim 20.

32. The product of the process as defined by claim 24.

33. The product of the process as defined by claim 27.

34. The product of the process as defined by claim 24, after the step (3) thereof.

35. The product of the process as defined by claim 24, after the step (4) thereof.

* * * * *